US007394190B2

(12) United States Patent
Huang

(10) Patent No.: US 7,394,190 B2
(45) Date of Patent: Jul. 1, 2008

(54) LUMINOUS LAMP HAVING AN ULTRAVIOLET FILTERING AND EXPLOSION PROOF THIN FILM

(75) Inventor: Fu-Kuo Huang, Tucheng (TW)

(73) Assignee: Nanoforce Technologies Corporation, Taipei County (TW)

( * ) Notice: Subject to any disclaimer, the term of this patent is extended or adjusted under 35 U.S.C. 154(b) by 0 days.

(21) Appl. No.: 11/315,493

(22) Filed: Dec. 23, 2005

(65) Prior Publication Data

US 2006/0279195 A1 Dec. 14, 2006

(30) Foreign Application Priority Data

Jun. 8, 2005 (TW) .............................. 94118868 A

(51) Int. Cl.
*H01L 33/00* (2006.01)
*H01J 1/62* (2006.01)
*C09K 11/06* (2006.01)

(52) U.S. Cl. ........................... 313/485; 313/112; 313/25

(58) Field of Classification Search ................... 313/25, 313/112, 489
See application file for complete search history.

(56) References Cited

U.S. PATENT DOCUMENTS 2,900,545 A * 8/1959 Rulon et al. ................ 313/502
5,418,062 A * 5/1995 Budd .......................... 428/403
6,819,049 B1 * 11/2004 Bohmer et al. .............. 313/635
6,888,302 B2 * 5/2005 Juestel et al. ............... 313/489

FOREIGN PATENT DOCUMENTS

JP 07226191 * 8/1995

* cited by examiner

*Primary Examiner*—Joseph L Williams
(74) *Attorney, Agent, or Firm*—Rosenberg, Klein & Lee

(57) ABSTRACT

A luminous lamp having an ultraviolet filtering and explosion-proof thin film is disclosed. An outside of a lamp is coated by a transparent layer which comprises phosphor powder. Energy generated by the lamp is absorbed by the phosphor powder while the lamp is shining. The phosphor powder would release energy to shot brilliance, so as to provide auxiliary lighting after turning off the lamp. Additionally, the phosphor powder can absorb harmful ultraviolet and other harmful radiations with shorter wavelengths to be one part of the thin film for filtering harmful radiations. The harmful ultraviolet can be transformed by the phosphor powder into visible light to red shift radiations with short wavelengths; hence the harmful radiations with shorter wavelengths can be eliminated. The illumination of visible light can be further increased. The transparent layer can catch broken fragments of the outside of the lamp to decrease accidents when the lamp is broken.

9 Claims, 2 Drawing Sheets

LUMINOUS LAMP HAVING AN ULTRAVIOLET FILTERING AND EXPLOSION PROOF THIN FILM

FIELD OF THE INVENTION

The present invention relates to a lighting fixture, and more particularly, to a lamp for auxiliary lighting by using phosphor powder for auxiliary lighting or for preventing ultraviolet shot from the lamp.

BACKGROUND OF THE INVENTION

Generally, lamp cups are always used for covering lamps. Therefore, extra lighting fixtures are needed to be a support for fixing the lamp cups.

In order to acquire the efficiency of auxiliary lighting, traditionally a small luminous lamp is then added after turning off the main lamp.

Moreover, a filter made by vacuum coating is used for filtering ultraviolet sent from a traditional lamp. That way is very expensive. The frequency filter only uses interferometric technique to filter ultraviolet which may harm the human body. Only energy loss is produced for the lamp and ultraviolet which has been filtered can not be transformed into visible light.

SUMMARY OF THE INVENTION

The primary object of the present invention is to provide a luminous lamp thin film having ultraviolet filtering and explosion-proof. A transparent layer is used to coat an outside of a lamp and comprises a phosphor powder. The energy sent from the lamp is absorbed by the phosphor powder when the lamp is shining. Brightness is released by the phosphor powder to provide auxiliary lighting after the lamp is turned off.

Another object of the present invention is a luminous lamp thin film having ultraviolet filtering and explosion-proof. The transparent layer is used to coat the outside of the lamp. The broken fragments can be caught by the transparent layer and, hence the broken fragments of the outside of the lamp would not be scattered to reduce accidents when the lamp is broken.

The further object of the present invention is to provide a luminous lamp thin film having ultraviolet filtering and explosion-proof. The phosphor powder is provided to absorb ultraviolet or other radiations with shorter wavelengths and can be a filter layer for filtering harmful radiations in order to reduce harming eyes and skins. Furthermore, the illumination of visible light can be increased to improve the efficiency of energy usage.

Other features and advantages of the present invention and variations thereof will become apparent from the following description, drawings, and claims.

DETAILED DESCRIPTION OF THE PREFERRED EMBODIMENTS

To make it easier for our examiner to understand the objective of the invention, its innovative features and performance, a detailed description and technical characteristics of the present invention are described together with the drawings as follows.

Figure 1:
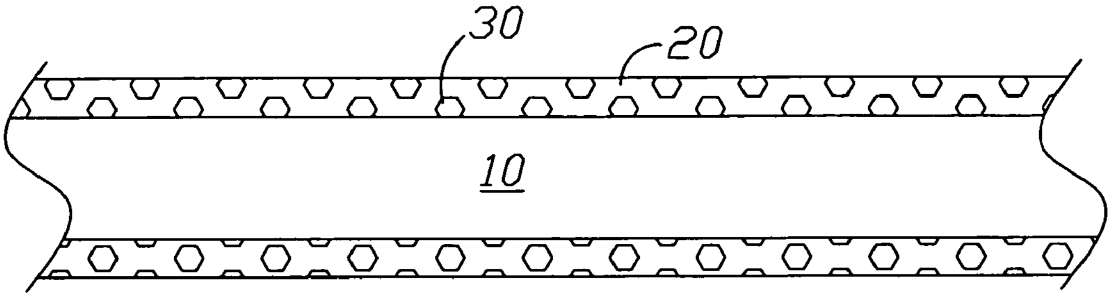
FIG. 1 is a structural drawing according to a preferred embodiment of the present invention.

Referring to FIG. 1, a structural drawing according to a preferred embodiment of the present invention is illustrated. As shown in FIG. 1, an outside of a lamp 10 is coated by a transparent layer 20. The transparent layer 20 comprises phosphor powder 30 and the transparent layer 20 comprises polymer.

Because the outside of the lamp 10 is coated by the transparent layer 20, the transparent layer 20 can catch broken fragments of the lamp 10 to reduce accidents when the lamp 10 is broken.

The transparent layer 20 includes the phosphor powder 30 and energy sent from the lamp 10 is absorbed by the phosphor powder 30 when the lamp 10 is shining. The energy is released by the phosphor powder 30 to shoot brightness to provide the performance for auxiliary lighting.

Figure 1A:
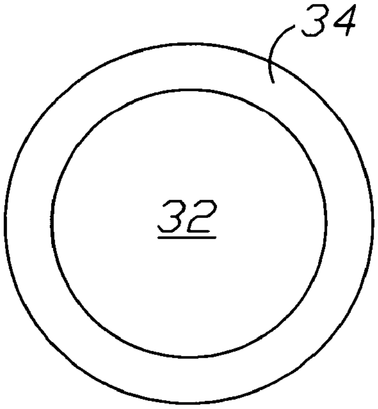
FIG. 1A is a structural drawing illustrating a powder particle of phosphor powder according to a preferred embodiment of the present invention.

Referring to FIG. 1A, a structural drawing illustrates a powder particle 32 of the phosphor powder 30. The powder particle 32 is coated by ceramics, e.g. alumina ceramics, titanate ceramics, ferrite ceramics, zirconate ceramics, silicon carbide ceramics, cordierite ceramics, beryllia ceramics, silicon nitride ceramics, and other ceramics. The vapor can be blocked by the powder particle 32 of the phosphor powder 30.

Because ultraviolet and or other radiations with shorter wavelengths are absorbed by the phosphor powder 30 to be energy level that can be excited. Therefore, those harmful ultraviolet or other harmful radiations with shorter wavelengths can be absorbed by the phosphor powder 30 to reduce harming people. The phosphor powder 30 can be a filter layer for filtering harmful radiations in order to reduce harming eyes and skins.

Moreover, the harmful ultraviolet can be transformed by the phosphor powder 30 into visible light to red-shift radiations with short wavelengths (the shorter wavelengths are shifted to the longer wavelengths). The radiations with shorter wavelengths which may harm people can be eliminated and the illumination of visible light can be further increased to improve the efficiency of energy usage.

Therefore, the traditional small luminous lamp can be replaced by the present invention. The transparent layer 20 can use spraying paint, transfer printing, rolling printing, screen printing, extruding or injecting shell and sleeves to take the transparent layer to coat the outside of the lamp during the night or in a power failure. The phosphor powder 30 can be added into a material, e.g. polymer, in order to mix with the transparent layer 20 adequately before manufacturing the transparent layer 20. A lamp thin film having photoluminescence material is then manufactured by using spraying paint, transfer printing, rolling printing, screen printing, extruding or injecting.

Figure 2:
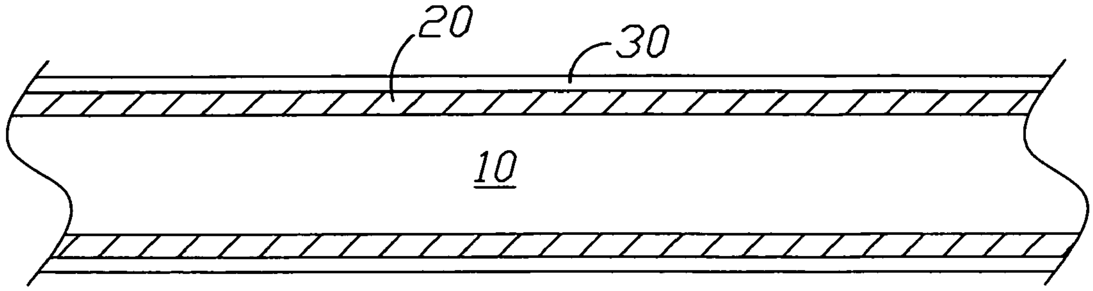
FIG. 2 is a structural drawing according to another embodiment of the present invention.
Figure 3:
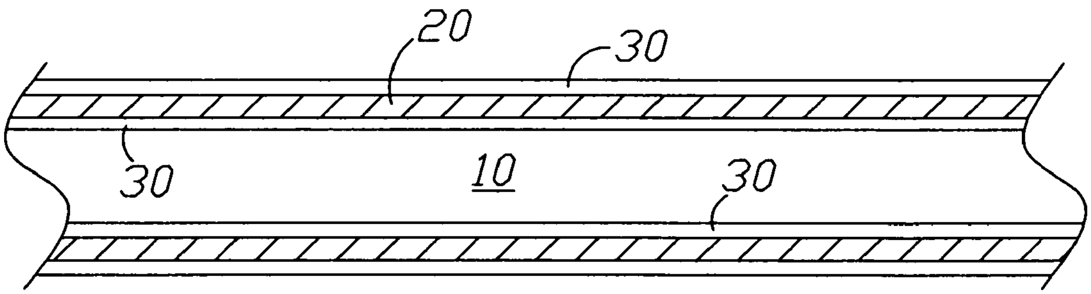
FIG. 3 is a structural drawing according to another embodiment of the present invention.

Referring to FIG. 2 and FIG. 3, other embodiments of the present invention are illustrated. Phosphor powder 20 is coated by the transparent layer 30 or the phosphor powder 20 is mixed into the transparent layer 30 or a phosphor powder is added into the material of the lamp.

Because the light shot by the lamp 10 is a discontinuous light, therefore, the phosphor powder 20 is utilized to absorb or emit light to enable the lamp 10 to mix with the light emitted by the phosphor powder 20 to be a continuous light, so as to reduce flash light.

Although the features and advantages of the embodiments according to the preferred invention are disclosed, it is not limited to the embodiments described above, but encompasses any and all modifications and changes within the spirit and scope of the following claims.

What is claimed is:

1. A luminous lamp apparatus having an ultraviolet filtering and explosion-proof thin film, comprising:

a lamp; and a transparent layer being made of a polymer material, applied to an outer surface of said lamp continuously contacting said lamp, said transparent layer containing a phosphor powder, whereby an outer layer of each phosphor powder particle is coated with a ceramic material.

2. The luminous lamp apparatus of claim 1, wherein said phosphor powder is selected from the group of afterglow phosphor and photoluminescence material.

3. A luminous lamp apparatus having an ultraviolet filtering and explosion-proof thin film, comprising:

a lamp providing a first illumination means;

a phosphor layer, coated on an outside of said lamp, continuously contacting said lamp; and a transparent layer being made of a polymer material, coated an outside of said phosphor layer, continuously contacting said phosphor layer.

4. The luminous lamp apparatus of claim 3, wherein said phosphor layer is selected from one of afterglow phosphor and photoluminescence material.

5. The luminous lamp apparatus of claim 3, further including said transparent layers to be coated between said lamp and said phosphor layer.

6. The luminous lamp apparatus of claim 3, wherein said phosphor layer comprises phosphor powders, and each powder particle of said phosphor powders being coated with a ceramic material.

7. A luminous lamp apparatus having an ultraviolet filtering and explosion-proof thin film, comprising:

a lamp;

a transparent layer made of a polymer material, coated an outside of said lamp, continuously contacting said lamp; and wherein said transparent layer containing phosphor powders; whereby said transparent layer catches broken fragments of said lamp when said lamp is broken.

8. A luminous lamp apparatus having an ultraviolet filtering and explosion-proof thin film comprising:

a lamp, a shell applied to an outer surface of said lamp and containing phosphor powder, said shells continuously contacting said lamp, an outer surface of each phosphor powder particle is coated with a ceramic material.

9. A luminous lamp apparatus having an ultraviolet filtering and explosion-proof thin film, comprising:

a fluorescent lamp; and a transparent layer containing a non-organic phosphor powder, said phosphor powder absorbing the invisible light to convert to visible light, wherein said transparent layer coated an outside of said fluorescent lamp.

* * * * *